United States Patent [19]

Gauge et al.

[11] 3,909,320

[45] Sept. 30, 1975

[54] METHOD FOR FORMING MOS STRUCTURE USING DOUBLE DIFFUSION

[75] Inventors: Thomas P. Gauge, San Jose; Joseph Kocsis, Saratoga; James R. Buchanan, Sunnyvale, all of Calif.

[73] Assignee: Signetics Corporation, Sunnyvale, Calif.

[22] Filed: Dec. 26, 1973

(Under Rule 47a)

[21] Appl. No.: 428,328

[52] U.S. Cl. .................... 148/187; 148/1.5; 357/23
[51] Int. Cl.$^2$........................................ H01L 21/223
[58] Field of Search .............. 148/1.5, 187; 317/235

[56] References Cited

UNITED STATES PATENTS

| | | | |
|---|---|---|---|
| 3,670,403 | 6/1972 | Lawrence et al. ........... | 148/187 UX |
| 3,793,090 | 2/1974 | Barile et al. .................... | 148/187 X |

OTHER PUBLICATIONS

Vadasz et al., "Silicon Gate Technology", IEEE Spectrum, Oct. 1969, pp. 28–35.

*Primary Examiner*—L. Dewayne Rutledge
*Assistant Examiner*—J. M. Davis
*Attorney, Agent, or Firm*—Flehr, Hohbach, Test, Albritton & Herbert

[57] ABSTRACT

Method for forming a semiconductor structure by providing a semiconductor body having an impurity of one conductivity type and forming a gate oxide layer of relatively precise thickness which is not thereafter removed on the surface of the semiconductor body. A protective layer is then formed on the gate oxide to protect it from being etched and also from contamination. An opening is provided which exposes the surface of the semiconductor body adjacent the gate oxide. First and second impurities of opposite conductivity types are caused to enter through the opening utilizing one edge of the gate oxide as a mask to provide first and second regions within the semiconductor body of opposite conductivity types to form a precisely controlled channel. Source, gate and drain metallization is provided to complete the device.

17 Claims, 46 Drawing Figures

METHOD FOR FORMING MOS STRUCTURE USING DOUBLE DIFFUSION

BACKGROUND OF THE INVENTION

This invention relates to processes for producing double diffused MOS devices.

Double diffused MOS devices have heretofore been provided. However, with such devices, it has been difficult to obtain the desired characteristics for such devices while at the same time making possible high yield. There is, therefore, a need for a new and improved process for making such MOS devices.

SUMMARY OF THE INVENTION AND OBJECTS

In the method for forming a semiconductor structure, there is provided a semiconductor body which has an impurity of one conductivity type. A gate oxide layer which is not thereafter removed is formed on the surface of the semiconductor body and has a relatively precise thickness. A protective layer is provided over the gate oxide layer so it will not be etched or become contaminated during subsequent processing steps. An opening is provided to expose the surface of the semiconductor body in a region adjacent the gate oxide. First and second impurities ar sequentially caused to enter through the opening utilizing the edge of the gate oxide as a mask so that first and second regions of opposite conductivity type are formed in a semiconductor body to provide a channel therebetween of relatively precise length. Source, gate and drain contact metallization is provided.

In general, it is an object of the present invention to provide a method for making an MOS structure utilizing double diffusion.

Another object of the invention is to provide a method of the above character applicable to metal gate and silicon gate processes.

Another object of the invention is to provide a method of the above character which can be utilized for discrete devices and monolithic integrated circuits.

Another object of the invention is to provide a method which can incorporate the use of beam lead metallization.

Another object of the invention is to provide a method of the above character in which the critical gate oxide is laid down first and is never removed.

Another object of the invention is to provide a method of the above character in which it is possible to accurately control the channel doping characteristics.

Another object of the invention is to provide a method of the above character in which there is a self-alignment of the channel, source and drain with respect to the gate oxide.

Another object of the invention is to provide a method of the above character which leads to lower parasitics and a higher frequency response.

Additional objects and features of the invention will appear from the following description in which the preferred embodiments are set forth in detail in conjunction with the accompanying drawings.

BRIEF DESCRIPTION OF THE DRAWINGS

FIGS. 36–42 are cross-sectional views showing the various steps utilized for fabricating a semiconductor structure incorporating the present invention utilizing a silicon gate for monolithic integrated circuits.

FIG. 43 is a partial top plan view of a completed device using the steps shown in FIGS. 36–42.

DETAILED DESCRIPTION OF PREFERRED EMBODIMENTS

Figure 1:
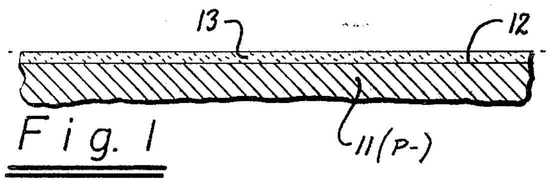
FIGS. 1–15 are cross-sectional views showing the various steps in the process for fabricating an MOS structure with a metal gate incorporating the present invention and particularly adapted for discrete devices.

The process or method for fabricating an MOS structure of the present invention is shown in the drawings beginning with FIG. 1. This process may be characterized as a metalgate process (self-aligned gate oxide) which is particularly adaptable for discrete applications. As will be seen from the process, there is provided a complete self-alignment of the gate oxide which is very critical for high frequency applications. A starting material for this method or process consists of a semiconductor body 11 formed of a suitable material such as silicon. The seimconductor body 11 can be in the form of either a thin N- epitaxial layer on a P- substrate having a crystalline orientation of <100> or, alternatively, just a P- substrate having a crystalline orientation of <100>. The latter type is shown in FIG. 1. In either event, the semiconductor body 11 is provided with a planar surface 12 which has a relatively thick layer 13 of an insulating material such as thermally grown silicon dioxide of a suitable thickness such as 8,000 Angstroms.

In the event that the epitaxial layer is used, the thickness of the epitaxial layer would be of the order 1.5 to 3 microns. It can be thicker or thinner depending upon the channel length desired.

Substrates having a crystalline orientation of <100> have been chosen because the mobility of electrons which are the main carriers in N channel devices is higher than with any other orientation in the substrate. The bonding pads will lie on this oxide 13 as hereinafter described. The oxide layer is relatively thick so as to reduce the associated parasitic capacitance.

Figure 2:
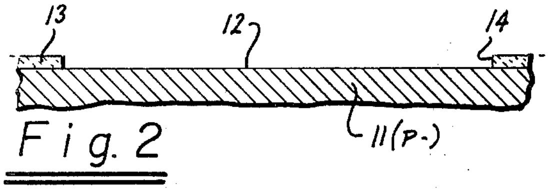

In FIG. 2, there is shown the formation of the first mask which is provided by forming openings or windows 14 in the layer 13 by suitable photolithographic techniques to expose the surface 12 of the semiconductor body 11. The sizes of the openings 14 are such that each generally defines the active area of a device which is to be formed in the semiconductor structure.

After the openings 14 have been formed, a gate insulating layer 16 in the form of silicon dioxide is formed on the surface 12. The formation of this gate oxide layer 16 is critical in the process. Its formation is one of the key control steps. After the gate oxide layer 16 is formed, it is never removed from over what will be the active channel area of the device to be formed. Extreme care should be taken to ensure high quality of the gate oxide. It is a dry silicon dioxide which is grown at approximately 1,150°C in a dry oxygen atmosphere to a thickness of approximately 1,000 ±50 Angstroms. The gate oxide layer 16 is annealed in a dry nitrogen atmosphere. Although approximately 1,000 Angstroms is the preferable thickness for the gate oxide, the thickness of the gate oxide can vary from 600 to 1,500 Angstroms.

Figure 4:
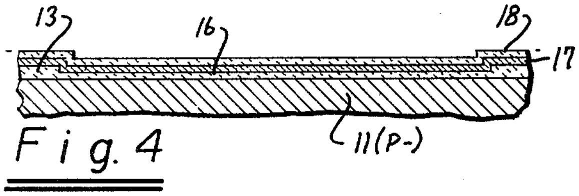

In order to ensure the quality of the gate oxide layer 16, it should be covered as quickly as possible with a suitable dielectric to protect the gate oxide layer from subsequent processing contamination. Thus, as shown in FIG. 4, there is deposited on the gate oxide layer 16 as soon as possible, a layer of silicon nitride 17 of a suitable thickness ranging from 500 to 1,500 Angstroms and preferably a thickness of approximately 1,000 ±100 Angstroms. This is accomplished by $SiH_4$ :$NH_3$ decomposition at 900°C for approximately three minutes. This is immediately followed by another silicon dioxide layer 18 also having a suitable thickness ranging from 500 to 1,500 Angstroms and preferably a thickness of approximately 1,000 ±100 Angstroms.

Figure 5:
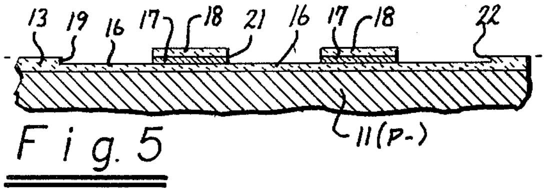

A second mask is then formed by photolithographic techniques utilizing photoresist by first selectively etching away portions of the silicon oxide layer 18 to expose portions of the silicon nitride layer 17. Utilizing the silicon oxide layer 18 as a mask, the exposed portions of the silicon nitride layer 17 are removed to form windows or openings 19, 21 and 22 which expose portions of the surface of the gate oxide layer 16 as shown in FIG. 5. A photoresist is then applied to the exposed surface exposed through a third mask and then developed so that a protective layer of photoresist overlies the inner portions of the silicon dioxide layer 18 adjacent the window 21 and to cover the gate oxide in the window 21. Thereafter, the gate oxide in the outside windows 19 and 22 is removed as well as the outer portions of the oxide layer 18 overlying the nitride layer 17 as shown in FIG. 5 so that the outer margins of the silicon nitride layer 17 provide good edge definition on the channel side of the device. Thus, the openings 19 and 22 extend downwardly to the exposed surface 12 of the semiconductor body 11. The presence of silicon nitride over the gate area prevents the etching of the gate oxide in this active area.

Figure 6:
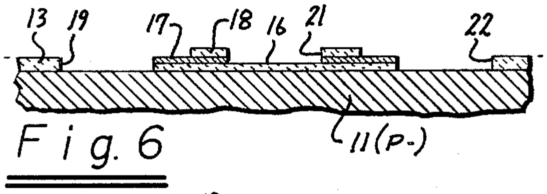
Figure 13:
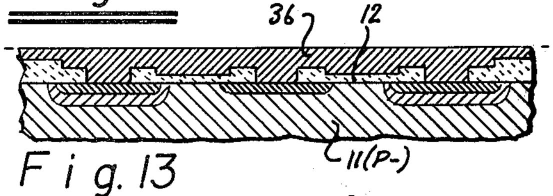

In the formation of the mask which is shown in FIGS. 5 and 6, it is desirable that the pattern which is utilized define relatively narrow areas for the windows 19, 21 and 22. The gate area for the device is determined by the width of the nitride layer 17 disposed on the gate oxide layer 16. This width is dependent upon the characteristics desired from the device. Generally, the higher the frequency of the device desired, the narrower the width of the nitride layer 17. Typically, this width can range from 5 to 200 microns. However, for high frequency devices, a typical width would be 9 microns. This width has been chosen because it is very reproducible and makes it possible to produce devices with a high yield.

Figure 7:
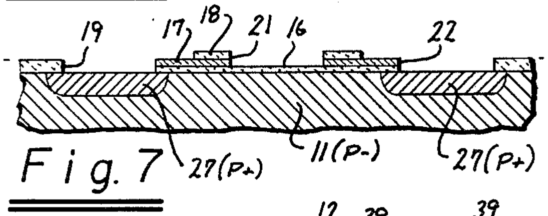
Figure 14:
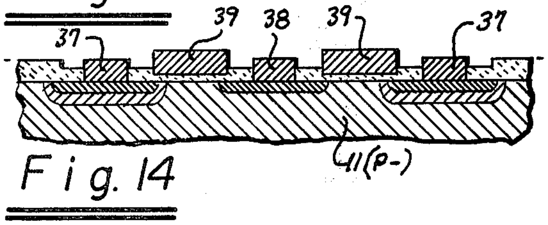

After the third mask has been formed, the channel predeposition and diffusion is carried out. This is accomplished by depositing a suitable P-type impurity such as boron into the windows 19 and 22 to cover the exposed surface 12 of the semiconductor body. This can be accomplished by use of a controlled diffusion source or by the use of ion implantation. Boron nitride is used as a source for the channel predeposition because it is very reproducible in terms of surface concentration and junction depth. After predeposition, the diffusion is carried out in a dry nitrogen atmosphere so as to prevent growth of silicon dioxode near the critical channel edge. If such precautions are not taken, considerable oxide might grow on the channel edge which would have to be removed subsequent to the source-drain predeposition and diffusion. This could lead to loss of edge definition of the channel region and could possibly lead to unreproducible characteristics for the device. As shown in FIG. 7, P+ diffused regions 27 are formed in the P- semiconductor body 11 which are generally dish-shaped in cross-section as shown in FIG. 7. It should be appreciated that the depth of the diffusion of the regions 27 determines the final channel length. In the case of a P-type semiconductor body, the depth of the diffusion is not critical. However, with respect to an N- epitaxial layer which can range in thickness from 1 to 3 microns, it is important that the P+ diffusion extend all the way through the epitaxial layer. For example, if the epitaxial layer is 1 micron in thickness, the P+ diffusion should extend through this 1 micron. Similarly, where the epitaxial layer is 3 microns in thickness, the P+ diffusion should extend through the 3 microns.

Figure 8:
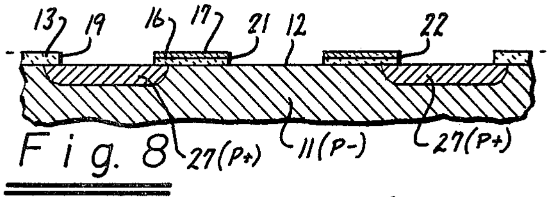

In FIG. 8, there is shown an optional step which is not absolutely necessary. When used, a photoresist is again applied to the surface of the device and conventional photolithographic techniques with a fourth mask are used to remove the portion of the gate oxide layer 16 in the window 21. Thus, it can be seen that the gate oxide has been removed from the center of the device and all that remains are the portions of the gate oxide layer which underlie remaining portions of the silicon nitride layer 17. Alternatively, if desired, the oxide layer 16 disposed in the window 21 could be removed by dipping the semiconductor body in a suitable etch in which the silicon nitride serves as the etch mask.

Figure 9:
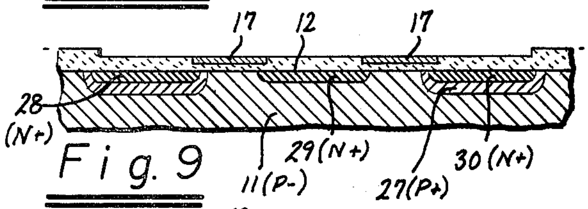

The source-drain diffusion is next carried out as shown in FIG. 9 by predepositing a suitable N+ impurity such as phosphorous into the windows 19, 21 and 22 and then diffusing in the N+ impurities downwardly into the semiconductor body to provide N+ regions 28, 29 and 30 with the N+ regions 28 and 30 being disposed within the P+ region 27. This source-drain diffusion is important because the actual channel dimensions and peak doping level are determined at this stage. In essence, the important parameters such as threshold voltage, source-substrate bias effects, transconductance and channel length are being adjusted at this stage. Note that the presence of the nitride during the wet N+ diffusion allows preferential thick oxide growth over the source and drain regions without affecting the gate region since it is protected by the silicon nitride. Little or no oxide will grow on top of the nitride and the gate oxide of precise thickness is preserved.

Figure 10:
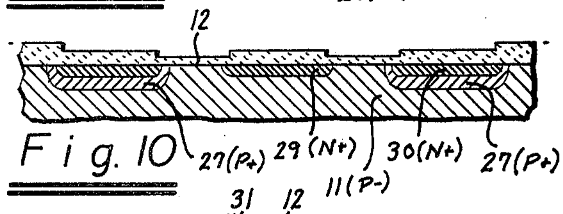
Figure 11:
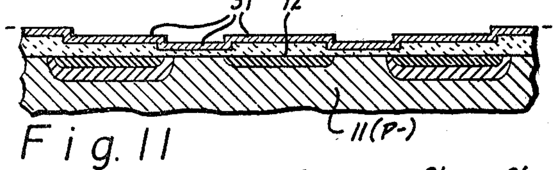

The remainder of the silicon nitride layer 17 is then etched away as shown in FIG. 10. As soon as the silicon nitride has been removed, it is desirable to cover the exposed portions of the gate oxide layer 16 to protect the same from future contamination. To accomplish this, a metal layer 31 is provided on the exposed surface of the silicon dioxide layer covering the semiconductor body as shown in FIG. 11. This metal layer can be formed in a suitable manner such as by depositing the same with an electron beam to a suitable thickness such as 5,000 ±200 Angstroms. Any suitable metal such as aluminum may be utilized.

It should be appreciated that the metal layer 31 is not absolutely necessary. It is merely utilized to ensure cleanliness of the gate oxide.

Figure 12:
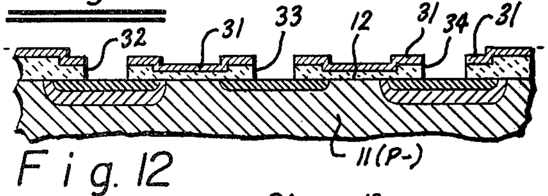

A fifth mask is then formed by suitable photolithographic techniques by etching through the metal layer 31 and then through the silicon dioxide layer 13 as shown in FIG. 12 to provide contact openings for the source and drain of the device. Thereafter, a second metal layer 36 is deposited into the openings 32, 33 and 34 and on the surface of the metal layer 31 in a suitable manner such as by electron beam deposition. The same or a similar metal can be utilized. Typically, the metal layer 36 is deposited to a suitable thickness such as 10,000 Angstroms. It is important that the layer 36 be sufficiently thick to ensure coverage of the steps.

Figure 3:
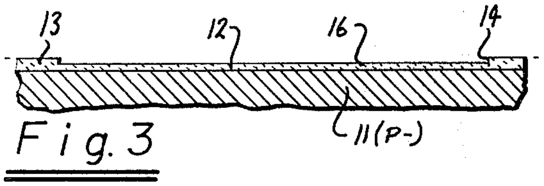

Thereafter, by suitable photolithographic techniques and a sixth mask, portions of the metal layer 36 are removed so that there remains a source metal contact structure 37 to make contact to the source, a center drain contact structure 38 which makes contact to the drain of the device and then the gate metal contact structure 39. It should be appreciated at this point that at no time was the thin gate oxide layer 16 underlying the gate metal contact structure 39 removed from the surface of the semiconductor body after it was first put in place in the steps shown in FIG. 3. This means that the doping profile for the channel was defined by the edges of the gate oxide so that there is exact self-alignment at the gate dielectric, namely the 1,000 Angstroms of gate oxide over the source, channel, drift and drain regions.

Figures 15, 16:
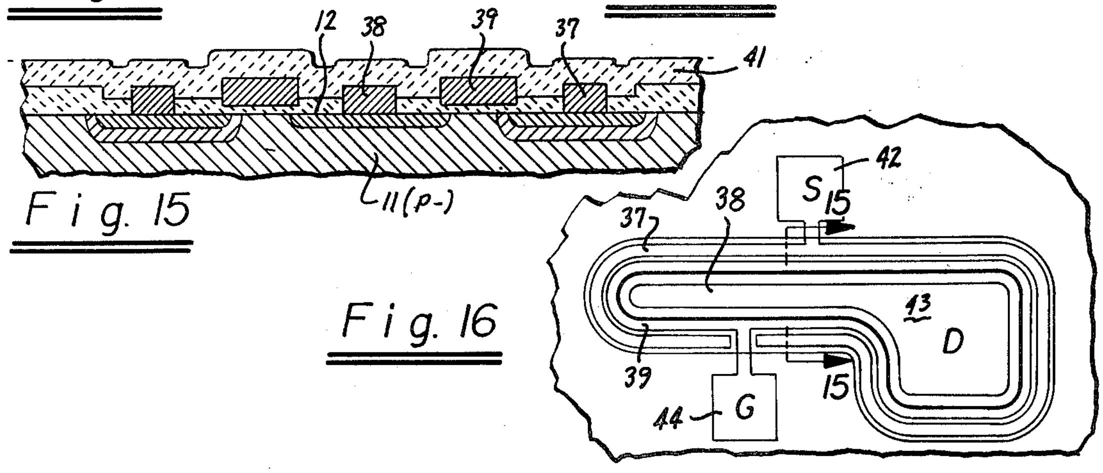
FIG. 16 is a plan view of a discrete device constructed in accordance with the steps shown in FIGS. 1–15.
Figure 17:
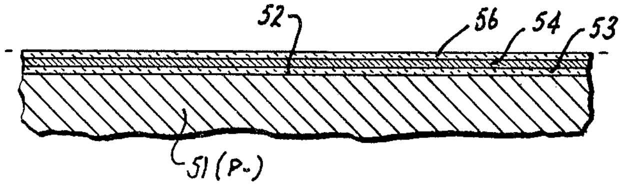
FIGS. 17–22 are cross-sectional views showing the steps utilized in connection with the present invention for forming metal gate devices for monolithic intergated circuits.
Figure 18:
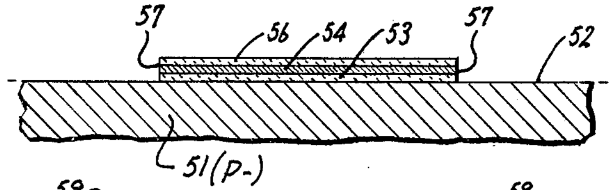
Figure 19:
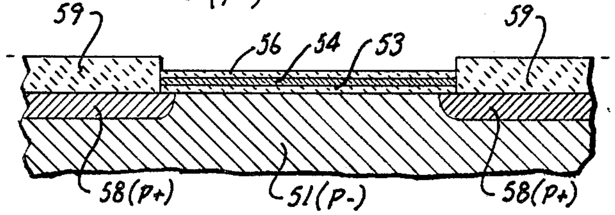
Figure 20:
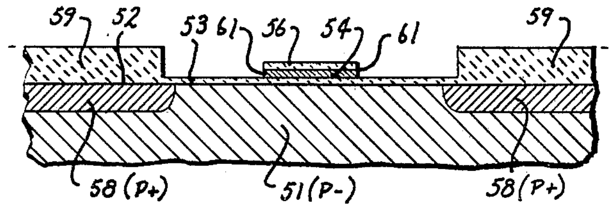

As soon as the source, drain and gate contacts have been formed on the device and alloying has been completed, S-glass which is phosphorous doped is deposited over the entire surface of the device to provide a glass layer 41 as shown in FIG. 15. In the final step, suitable photolithographic techniques with a seventh mask are utilized to open windows (not shown) in the glass layer 41 to expose the source, drain and gate bonding pads 42, 43 and 44 respectively of the device (see FIG. 16) so that contact can be made to them to connect the device to the outside world. The S-glass serves the purpose of giving some form of final gettering and passivation. This is particularly advisable if a drain offset gate metal is utilized such that a thin gate oxide would be exposed.

As can be seen from FIG. 16, the completed device is in the form of a closed structure which means that the drain region is completely surrounded by the gate region. It will be noted that the source contact structure 37 is interrupted at one location to provide a space 46 through which the gate contact pad 44 extends. Since the drain region is completely surrounded by the gate region, there is no possibility of a leakage path from the drain to the source except under the control of the gate.

The drain is shaped in the manner shown in FIG. 16 so that there is provided a large area to which a bond can be made from the outside world as, for example, by means of a thermocompression bond. Similar bonds may be made to the source and gate pads 42 and 44.

The process hereinbefore described for fabricating a discrete metal gate device as set forth in FIGS. 1–14 is for a one micron channel length, although this can be varied in either direction.

By way of example, the important device parameters for the process hereinbefore described are:

| | |
|---|---|
| Channel diffusion depth | 3 $\mu$ m |
| Source-drain diffusiion depth | 2 $\mu$ m |
| Channel length | 1 $\mu$ m |
| Threshold voltage | +(1.0 ±0.2) volts |
| Transconductance $g_m/Z$ at $V_G$ = +5 volts | (18 – 20) mhos/$\mu$ m |
| $V_D$ max | 30 volts |

With a gate perimeter of approximately 800 microns, it is possible that approximately 20 $\mu$ mhos of transconductance are obtained per micron of gate perimeter. By virtue of the channel length, the saturation resistance of the device is very small; for example, typically it is 30 ohms with only 5 volts on the gate.

From one of the devices used as a high frequency device, the device typically has a gain of 10 dB to 14 dB at a frequency of 1 GHz. The noise figure at 1 GHz is typically 4 to 4.5 dB. The device has low cross-modulation distortion characteristics. Also, it has a rise time of less than half a nanosecond.

In the construction shown in FIGS. 15 and 16, it can be seen that a P— substrate has been used. However, as explained previously, it is possible in conjunction with the present invention to utilize an N— epitaxial layer on a P— substrate. When the N— epitaxial layer is utilized, the N— region is in the drift region of the device as opposed to the P— region being the drift region when the P— substrate is used exclusively. It has been found that it is possible to obtain much higher operating voltages when N— drift regions are used. Thus, it would be desirable to utilize N— epitaxial layers on a P— substrate when it is desired to obtain higher voltage devices. It also is desirable to utilize N— epitaxial layers on P— substrates when it is desired to obtain very narrow channels. Utilizing the double diffused structure and process hereinbefore described, it is possible to obtain very narrow channels as, for example, less than one-half micron. In fact, it should be possible to obtain channels having a length of a few thousand Angstroms for microwave devices. Thus, in summary, the use of an N— epitaxial layer on a P— substrate should be desirable where very narrow channel devices are required or where high voltage devices are required.

In FIGS. 17 through 22 there are shown steps of a process which represent minor modifications of the process hereinbefore described to make the metal gate devices produced more suitable for use in monolithic integrated circuits. For such purposes, a semiconductor body 51 of a P— conductivity is utilized exclusively having a resistivity ranging from 15 to 30 ohm cm. The semiconductor body 51 is provided with a planar surface 52 and the semiconductor body has a <100> crystal orientation with respect thereto. The formation of the first oxide layer and the use of a mask for providing openings therein is eliminated. A gate oxide layer 53 is formed on the surface 52 to a suitable thickness such as 1000 ±50 Angstroms although greater or lesser thicknesses may be used as hereinbefore described in conjunction with the previous embodiment. Again, care must be taken so that the gate oxide is very clean. Immediately thereafter, a layer 54 of silicon nitride of a suitable thickness such as 1,000 Angstroms is grown on the gate oxide layer 53 and thereafter a silicon dioxide layer 56 of a suitable thickness such as 3,000 Angstroms is grown on the silicon nitride layer. The greater thickness for the silicon dioxide layer 56 is utilized because it is necessary that the layer 56 be able to withstand longer etching times as is hereinafter apparent.

Conventional photolithographic techniques are then utilized in conjunction with a first mask to provide moats or openings 57 which expose the surface 52 so that there remains a suitable pattern of oxide, silicon nitride and oxide which covers the active area of each device. The openings 57 are formed by utilizing a selective etch and using a photoresist which protects the desired portion of the oxide layer 56. The exposed silicon nitride is then removed using a selective etch and thereafter the exposed thin layer of silicon dioxide 53 is removed using another selective etch. In this way it can be seen that the thin layer 53 of silicon dioxide is protected by the silicon nitride layer which, in turn, is protected by the silicon dioxide layer 56 to provide the desired pattern as, for example, rectangular for the active area of the device. In other words, everything is removed outside of the active area of the device.

As soon as the openings 57 have been formed, the semiconductor body 51 in the form of a wafer has a suitable P type inpurity injected therein, such as boron, by utilizing a predeposition step and thereafter diffusing the boron into the exposed portions of the surface 52 by diffusing it therein in a wet oxygen atmosphere to provide a P+ region 58 which extends downwardly and inwardly beneath the gate oxide layer 53 so that there is provided anywhere outside of the active device area a high concentration of P type impurity in order to eliminate thick field inversion and/or N+ to N+ leakage paths along the surface. The diffusion of the P+ impurity is in a wet oxygen atmosphere so that there will grow on exposed areas of the surface 12 a relatively thick oxide layer 59 as shown particularly in FIG. 19. The active area of the device is preserved intact because of the thick oxide layer 59 can be selectively grown without affecting the active area of the device. This is because oxygen does not penetrate the silicon nitride layer and, therefore, the gate oxide layer 53 remains at its original thickness. The surface concentration should be low enough to keep subsequent drain breakdown voltage reasonable (20 volts) and P-N junction capacitance low, and yet high enough to keep the thick field threshold voltage large (greater than 15 volts). It has been found that boron nitride, as a diffusion source, gives enough control to allow surface concentration, after diffusion, in the range ($6\times10^{16}-10^{17}$) $cm^3$, thereby satisfying all constraints.

Thereafter, by the use of conventional photolithographic techniques and a second mask, openings 61 are formed in the oxide layer 56 and in the silicon nitride layer 54 to define the gate area in much the same manner as in connection with the previous embodiment of the invention.

Figure 21:
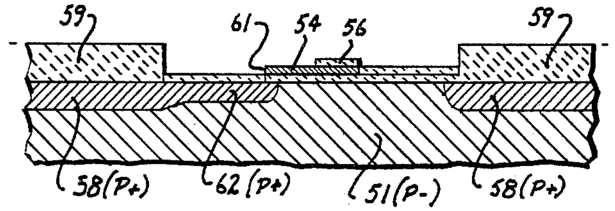
Figure 22:
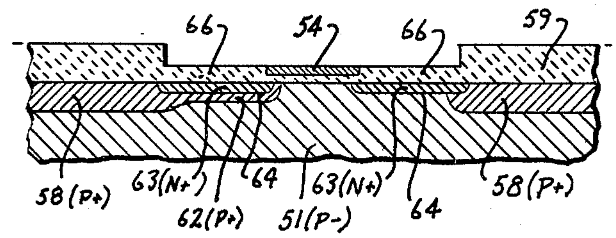

In the previous embodiment, the gate oxide layer 53 is removed in the opening 61 as well as a portion of the upper oxide layer 56 so that the outer margin of the silicon nitride layer provides good edge definition on the channel side of the device, as shown in FIG. 21. As can be seen, the thin oxide layer 53 is only removed from one side. The channel diffusion is then carried out by depositing a suitable P type impurity such as boron from boron nitride in the open window 61 to provide a P+ region 62 which extends beneath the gate oxide layer 53 as shown in FIG. 21 and joins with the P+ region 58. This channel diffusion step is preferably carried out in a dry nitrogen atmosphere to minimize the growth of silicon dioxide. The thin oxide layer which is present on the drain side of the gate after the channel diffusion step is removed in a suitable manner such as by dipping the water in a suitable etch. The thick oxide layer 59 in the field serves as a mask as does the silicon nitride layer 54. The remaining portion of the oxide layer 56 is removed at the same time as the oxide layer on the drain side of the channel. Because the oxide on the drain side is relatively thin, it can be readily removed without any substantial undercutting of the gate oxide on the channel region side of the gate oxide.

The source-drain diffusion step is next carried out by predepositing a suitable N-type impurity such as phosphorous and then diffusing the same into the surface 52 to provide N+ regions 63 which are defined by dish-shaped P-N junctions 64 extending to the surface 52. The channel which is formed is very precise because both diffusions have been carried out utilizing the edge of the silicon nitride layer 54 to define the channel. Since the N+ diffusion step is carried out in a wet oxygen atmosphere, silicon dioxide layers 66 will form the openings 61. As pointed out previously, this preferentially thick oxide grown over the source and drain regions occurs without affecting the thickness of the gate oxide layer 53 because of the protection provided by the silicon nitride layer 54.

The silicon nitride layer 54 is then removed in a suitable manner such as by etching. Therefore, if desired, an ion implant step can be utilized for shifting the threshold voltage in a manner well known to those skilled in the art.

The remainder of the steps required for completing the device are very similar to those disclosed in connection with the previous embodiment and, therefore, will not be described in detail. In general, the contact structure is formed by first depositing a layer of metal and then etching away the undesired metal. Thereafter, a phosphorous doped glass can be deposited and photolithographic techniques are utilized in conjunction with a mask to form openings to the bonding pads of the device. Thus, as shown in plan view in FIG. 23, there is provided source, gate and drain metal contact structures 67, 68 and 69 which are connected to pads 71, 72 and 73, respectively.

The process hereinbefore described can be used to produce conventional N-channel devices by elimination of the mask before the channel predeposition and diffusion step from those areas where devices of the present invention are not required. Because of the P-substrate resistivity, the conventional devices will turn out depletion mode and as such are unsuitable, for example, for enhancement mode clocked logic. As pointed out previously, a threshold adjust tool is boron ion implantation through the gate oxide of the device.

Figure 23:
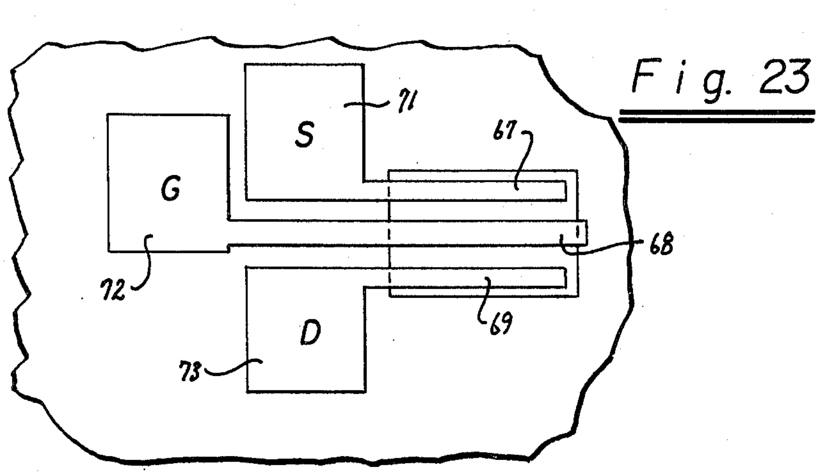
FIG. 23 is a top plan view of the device constructed in accordance with the steps shown in FIGS. 17–22.

In FIG. 23, it can be seen that a closed structure has not been provided. In other words, the gate does not completely surround the drain. The construction shown in FIG. 23 makes it possible to use the same geometry in monolithic integrated circuits because contact can be easily made with the drain region by a lead carried by the surface which is not possible with the closed structure. With such an open structure, it is necessary to compensate the active region as hereinbefore described so that there is no leakage from the source to drain of one device or from the source or drain of one device to any other device.

The process hereinbefore described is very compatible with conventional N-channel processing. Where it is desired to have conventional N-channel devices, it is merely necessary to omit the P+ diffusion forming the regions 62 in those areas, N-channel devices would be formed in those particular regions. This would be advantageous in logic integrated circuits because the use of conventional MOS devices as loads would lead to size and speed advantages.

It should be apparent that the two processes hereinbefore described have several common basic advantages. First, in both processes here is self-alignment of the active gate area which is very important because minimization of capacitance is very important. The second feature of both processes is that the chemical doping profile of the double diffused channel is controlled by virtue of the fact that the gate oxide is never removed from the outset and all the diffusions are carried out under it. Therefore, there is no chance for contamination or redistribution of the profile by subsequent oxidation. In addition, the characteristics which can be obtained are very reproducible. Also, by use of the silicon nitride over the gate oxide region and utilizing the selective etching properties of oxide versus nitride, it is possible to open up the source side of the device perfectly (no error) without resorting to high tolerance masking techniques.

In FIGS. 24–34, there is shown a process for a double diffused MOS silicon gate process for discrete devices. The starting material in the form of a semiconductor wafer or body 81 is formed of N− epi on a P− substrate having a <100> crystal orientation or in a P− substrate having a <100> crystal orientation for reasons hereinbefore set forth. The wafer or body 81 is provided with a planar surface 82 upon which there is formed a thick layer 83 of a suitable insulating material such as silicon dioxide. The layer 83 is formed by thermally growing the same in a wet oxygen atmosphere to a suitable thickness as, for example 8,000 Angstroms. Suitable photolithographic techniques with a first mask are utilized for forming windows 84 for the active areas of the devices. A gate oxide carefully controlled thickness as, for example, 1000 ±50 Angstroms is grown in a dry oxygen atmosphere in the openings 84 to provide the gate oxide layer 86.

Figures 24, 25, 26, 27, 28, 29, 30, 31, 32, 33, 34, 35:
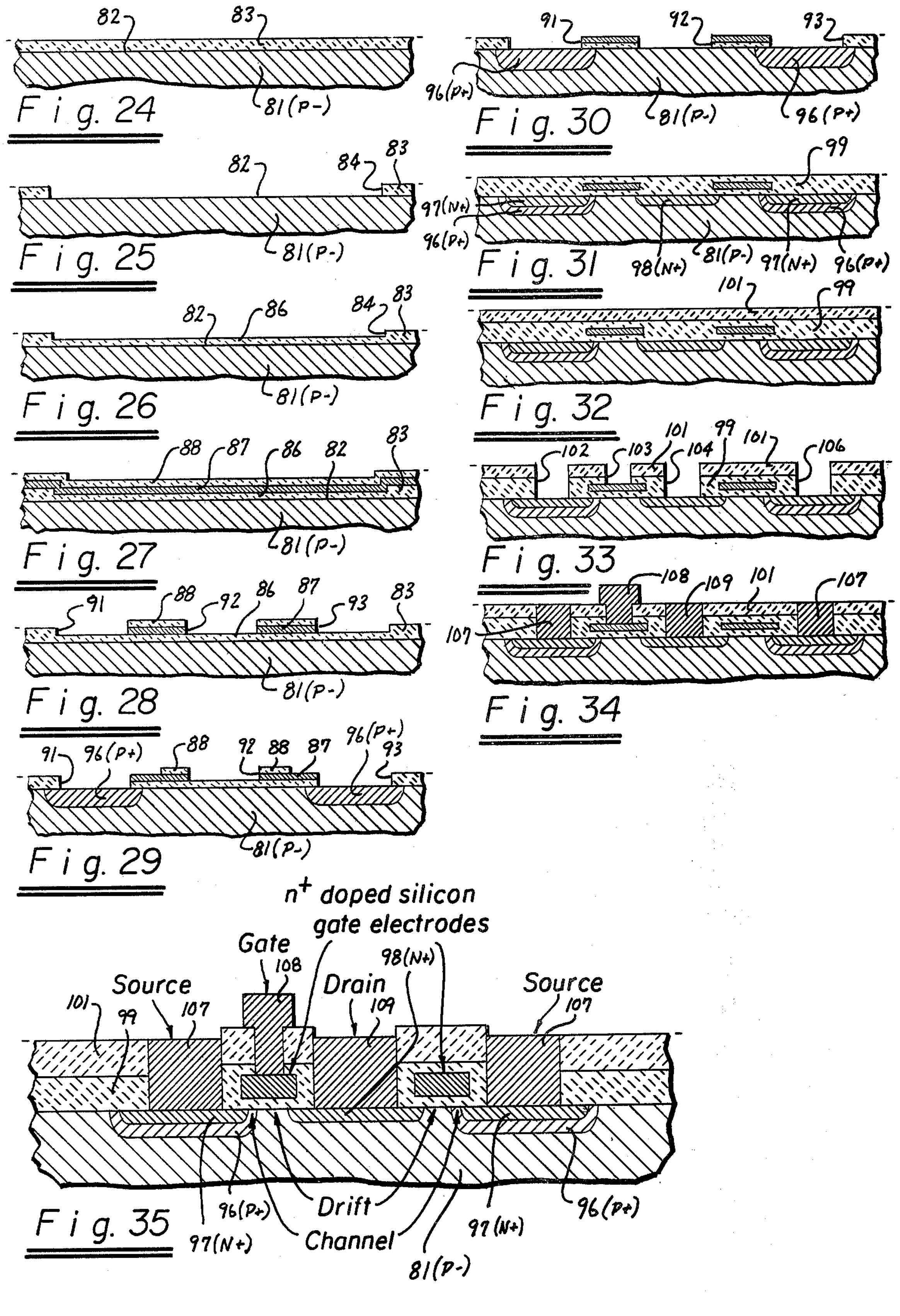
FIGS. 24–35 are cross-sectional views showing the steps for forming the discrete semiconductor structure incorporating the present invention utilizing a silicon gate.

As soon as the gate oxide layer 86 has been formed, a protective dielectric layer is formed by growing a layer 87 of polycrystalline material to a suitable thickness as, for example, 6,000 Angstroms. As can be appreciated, this polycrystalline silicon layer is substituted for the silicon nitride layer deposited in the previous processes hereinbefore described. After the polycrystalline silicon layer has been formed, a silicon dioxide layer 88 of a suitable thickness such as 3,000 Angstroms is formed on the polycrystalline layer 87 as shown in FIG. 27. The silicon dioxide layer 88 is grown to a greater thickness, that is, 3,000 Angstroms rather than 1,000 Angstroms as in the previous discrete process because the silicon dioxide layer will be attacked during the etch of the silicon but at a slower rate than the silicon, whereas it is practically untouched during the nitride etch. Hence a thinner masking oxide need be provided when the nitride is utilized instead of polycrystalline silicon.

By the use of photolithographic techniques and a second mask, openings 91, 92 and 93 are formed in the silicon dioxide masking layer 88 and the polycrystalline layer 87. In the formation of the openings, the photoresist is utilized for masking the oxide layer 88 and then the oxide layer 88 is utilized for masking the polycrystalline layer 87. Thereafter, suitable photolithographic techniques with a third mask are utilized to remove the gate oxide 86 in the outside windows 91 and 93 and at the same time removing a portion of the outer portions of the top layer 88 so that the polycrystalline silicon will provide a sharp edge for the subsequent diffusion step as shown in FIG. 29. The channel predeposition and diffusion step of the P-type impurity is carried out in a dry nitrogen atmosphere to form the P+ regions 96 in which the polycrystalline silicon layers 87 are utilized for defining the edges of the P+ regions. In the event that all of the masking oxide is removed from on top of the polycrystalline silicon, some of the P-type impurities such as boron will diffuse into the polycrystalline silicon layer 87. This is not undesirable because the P+ impurities in the polycrystalline silicon will be swamped out completely during the source-drain predeposition and diffusion step with the polycrystalline silicon becoming highly N+. As in the previous processes, the edge preservation by diffusion in a dry nitrogen atmosphere and a controlled P-doping profile are of extreme importance.

The gate oxide 86 in the window 92 can then be removed by dipping the wafer in a suitable etch. Alternatively, the source and drain regions can be protected by a photoresist and by utilization of a mask, the central oxide area 86 can be removed. In any event, all of the oxide should be removed from the top of the polycrystalline layers 87 so that the N+ impurities can dope the gate electrode during the next step.

Thereafter, the source-drain predeposition and diffusion step is carried out in a wet oxygen atmosphere. N+ regions 97 are formed within the P+ regions 96 to form the channels in the same manner as in the previous processes. It can be seen that the edge of the polycrystalline silicon serves as the edge definition for the formation of the N+ regions 97 and, therefore, the channels. At the same time, an N+ region 98 is formed in the central opening 92. At the same time that the N+ regions are being formed, the polycrystalline layers 87 are being doped with the same N-type impurity. A thick silicon dioxide layer 99 grows in the openings 91, 92 and 93 and some also grows on top of the polycrystalline silicon layers 87 as shown in FIG. 31.

A layer 101 of phosphorous-doped glass is then deposited over the silicon dioxide layer 99 as shown in FIG. 32. This phosphorous-doped or straignt S-glass on top of the polycrystalline silicon reduces the number of pinholes in the oxide over the polycrystalline silicon regions.

Suitable photolithographic techniques are utilized in conjunction with a fifth mask to form openings 102, 103, 104 and 106 which extend through the phosphorous-doped glass and the thick silicon dioxide layer to expose the source and drain regions and the gate electrodes. A layer of metal is deposited over the surface of the glass layer 101 and into the openings and thereafter by suitable photolithographic techniques and a sixth mask, the undesired metal is removed to provide a source contact structure 107, a drain contact structure 109 and gate metallization 108.

A plan view of the finished device shown in FIG. 35 would have an appearance very similar to that of the device shown in FIG. 16.

From the foregoing, it can be seen that in the structure shown in FIG. 35, N+ doped silicon gate electrodes are provided. Again, it can be seen that the complete device was fabricated without removing the gate oxide under the gate electrode. Basically, it is the same structure as hereinbefore described in connection with the previous process in which the silicon nitride was utilized with the exception that polycrystalline silicon has been substituted for the silicon nitride and the silicon nitride was removed before the device was completed.

It can be seen that with the silicon gate process the gate electrode which is the polycrystalline silicon is by definition completely over the channel, source and drain regions, and in particular the silicon overlaps the silicon gate oxide which overlaps the N+ region of the drain. This leads to high feedback capacitance. In the silicon gate process, the silicon gate cannot be removed to offset it from the drain region, whereas in the metal gate process, the metal can be placed where desired. It can be offset from the drain region to provide very low feedback capacitance devices as, for example, in linear circuits. The present silicon gate process is limited because of the high feedback capacitance because the gate electrode overlaps the N+ drain region.

In other words, an offset drain gate electrode cannot be employed because the gate electrode defines the source and drain regions. This means that there is overlap capacitance at the drain side of the gate because of sidewise diffusion of the N+ impurities. The resulting feedback capacitance of the silicon gate device is, therefore, larger than for comparable metal gate devices where the drain offset principle can be utilized.

The principal feature disclosed in conjunction with the silicon gate process is that the double diffusion process is compatible with silicon gate processes.

It should be appreciated that it is possible to eliminate the N+ sidewise diffusion on the drain side of the gate by utilization of ion implantation for the N+ impurities in the drain region.

Use of the double diffused MOS silicon gate process for monolithic integrated circuits can now be explained in conjunction with FIGS. 36–42. As can be seen from the drawings, there are provided two versions of the process in which Version 1 is represented by FIGS. 36A, 37A and 38A, and Version 2 is represented by FIGS. 36B, 37B and 38B. As will be hereinafter apparent, the first version eliminates a mask and gives self-alignment of the double diffused MOS device in the Z direction as is also the case with the metal gate monolithic IC process.

Figures 36A, 36B, 37A, 37B, 38A, 38B, 39, 40, 41, 42, 43:
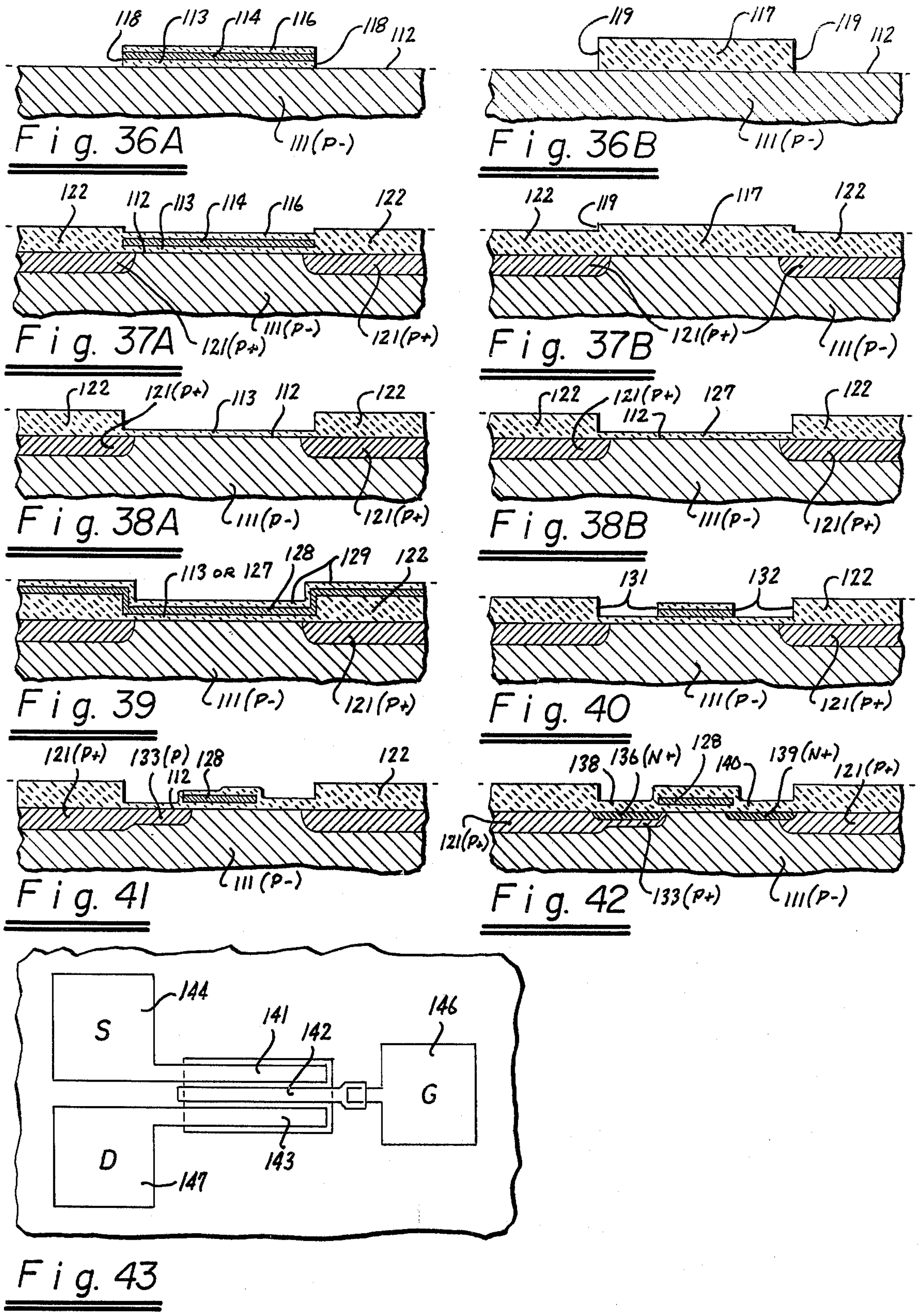

In both versions, the starting material is a P− substrate having a <100> crystalline orientation. The substrate or body 111 is provided with a planar surface 112. In Version 1 as shown in FIG. 36A, an oxide silicon nitride sandwich is provided in the form of a thin silicon dioxide layer 113 in a thickness of 1,000 Angstroms upon which there is deposited a layer 114 of silicon nitride in a thickness of 1,000 Angstroms and upon which there is deposited a layer 116 of silicon dioxide of 1,000 Angstroms in thickness. Alternatively, as shown in FIG. 36A of Version 2, a thick layer of silicon dioxide 117 can be thermally grown in a wet oxygen atmosphere to a suitable thickness as, for example 8,000 Angstroms.

By the use of suitable photolithographic techniques and a mask, the active device area is defined as shown in FIG. 36A by successive removal of the silicon dioxide layer, the exposed silicon nitride layer 114, and thereafter the thin silicon dioxide layer 113 so that there is provided an opening 118 which surrounds the sandwich of oxide and silicon nitride layers which may have a suitable geometry such as rectangular. By similar photolithographic techniques and a mask, the opening 119 through the thick oxide layer 117 can be formed in the structure shown in FIG. 36B so that the remaining portions of the thick oxide layer define the active device areas.

Compensation of the inactive area of the device is accomplished by diffusing a P-type impurity into the exposed surface areas 112 of the semiconductor body or wafer 111 to provide P+ regions 121 with the selective formation of thick oxide layers 122 during the diffusion in the wet oxygen atmosphere as shown in FIGS. 37A and 37B.

Thereafter, as shown in FIG. 38A, the oxide layer 116 can be removed by dipping in a suitable etch. The silicon nitride layer then can be removed so that there remains the thin gate oxide layer 113.

In Version 2 of the process, photolithographic techniques in connection with a mask are used for forming an opening 126 for the active area of the device in the thick oxide layer 122 to expose the surface 112. Thereafter, a thin gate oxide layer 127 is formed in the opening 126 on the surface 122 as shown in FIG. 38B. From this point on, the steps in both versions are the same. Thus, as shown in FIG. 39, a layer 128 of polycrystalline silicon is deposited on the thin oxide layer 113 or 127 and over the outer thick oxide layer 122 to a suitable thickness as, for example, 6,000 Angstroms. Thereafter, a layer 129 of masking silicon dioxide is deposited on the polycrystalline silicon layer 128 to a suitable thickness as, for example, 3,000 Angstroms. By the use of suitable photolithographic techniques and a mask, openings 131 and 132 are formed by first utilizing the photoresist to protect a portion of the oxide layer and etching to the exposed oxide and thereafter using an etch to attack the polycrystalline silicon using the oxide as a mask. Thereafter, utilizing a further mask, the thin silicon dioxide layer in the opening 131 is removed as well as a portion of the oxide on the polycrystalline silicon layer 128 adjacent the channel which is to be formed. A P-type impurity is then diffused through the opening 131 into the surface 112 utilizing the exposed edge of the polycrystalline silicon layer 128 to provide an edge for the diffusion so that there is provided a P-type region 133 extending beneath the gate oxide and extending into the P+ field compensation. The diffusion is carried out in a dry nitrogen atmosphere to minimize any growth of silicon dioxide. Thereafter, the wafer 111 is dipped in a suitable etch to remove the thin oxide layers from the source and drain regions and from the top of the polycrystalline silicon layer 128.

As soon as this is accomplished, the source-drain predeposition and diffusion step is carried out by diffusing a suitable N-type impurity into the surface 112 in a wet oxygen atmosphere to form N+ regions 136 and 139. In the time that the N+ regions are being formed, relatively thick oxide layers 138 and 140 are being formed in the source and drain regions. During the diffusion of the N-type impurity, the polycrystalline gate is also diffused with the N-type impurity. Thereafter, a phosphorous-doped or S-glass layer is deposited over the entire surface of the structure as shown in FIG. 42. Photolithographic techniques are utilized in conjunction with a contact mask to form contact openings to the source, drain and gate. Thereafter, a metal layer of a suitable thickness such as 1½ microns is evaporated onto the surface and into the contact openings. A mask in conjunction with conventional photolithographic techniques is provided for removing the underside metal. A plan view of a completed device is shown in FIG. 43 in which the source contact metallization 141, the gate metallization 142 and the drain contact metallization 143 is provided along with source, gate and drain contact pads 144, 146 and 147, respectively.

The principal virtue of the silicon gate process for MOS monolithic IC's is that it makes possible much higher packing density (because two layers of interconnects are utilized). Note that in the case of the double diffused MOS silicon gate circuits, the silicon gate is doped N+ as opposed to P+ which is the case for P-channel silicon gate circuits. This makes possible much lower ohms per square on the silicon interconnect lines and, therefore, smaller RC charging time constants. When conventional silicon gate N-channel devices are used along with the double diffused MOS devices, there is a need for raising the threshold voltage to positive values. Ion implantation in the step after completion of the structure shown in FIGS. 38A and 38B would make this possible.

From the foregoing process shown in FIGS. 36–42, it can be seen that there is provided a single discrete device with the source and drain isolated and in which the field is compensated. The packing density of the silicon gate is superior to the metal gate because in the silicon gate there is the silicon layer which has been doped which provides an extra layer of interconnects.

There is a disadvantage in that there is higher feedback capacitance than with the metal gate process by virtue of the fact that the N+ silicon gate overlaps the drain N+. As pointed out previously, with the metal gate process, there is the option of offset the gate to provide the low feedback capacitance when it is desirable in certain circuit functions.

In place of the contact metallization hereinbefore described in connection with the various processes, it should be apparent that the conventional beam lead process can be utilized to provide beam leads for the devices when it is desirable. The beam lead process is readily adaptable to the double diffused MOS processes and does not degrade the devices.

It is apparent from the foregoing that there has been provided a process utilizing double diffusion which is applicable to metal gate (self-aligned gate oxide) for discretes and monolithic IC's, and silicon gate (self-aligned gate oxide and electrode) for discretes and monolithic IC's. In all of the processes, the critical gate oxide is first laid down and is never removed after it is put down and is protected during the processing so that it does not become contaminated. This makes it possible to provide devices having controlled channel doping characteristics which are reproducible. Also, there is the self-alignment of the channel, source and drain which leads to lower parasitics and, therefore, higher frequency response. The processes relate to discrete and monolithic integrated circuits for linear and logic circuits.

We claim:

1. In a method for forming an MOS structure, providing a semiconductor body of silicon having an impurity of one conductivity type and having a generally planar surface, forming a gate layer of silicon dioxide of relatively precise thickness on said surface, providing a protective structure on said gate layer, forming an opening in said protective structure adjacent said gate layer and exposing said surface, causing first and second impurities to pass through said opening utilizing the edge of said protective structure as a mask to provide first and second regions of different conductivity types in said semiconductor body and to provide a channel of precise length underlying the gate layer, removing the protective structure from the gate layer after formation of the first and second regions, and forming gate, source and drain contact metallization.

2. A method as in claim 1 wherein said protective structure includes a metal formed over said gate layer.

3. A method as in claim 1 wherein said protective structure includes a layer of polycrystalline silicon formed over said gate layer and wherein said polycrystalline silicon is doped with an impurity of one conductivity type.

4. A method as in claim 3 wherein said semiconductor body carries a P-type impurity and wherein said first and second diffusions are carried out by diffusing P-type and N-type impurities respectively and wherein an N-type impurity is diffused into said polycrystalline layer overlying said gate layer.

5. A method as in claim 1 together with the step of depositing a P-type impurity in the semiconductor body in a region remote from said gate layer.

6. A method as in claim 1 wherein said gate layer is formed to a thickness ranging from 600 to 1,500 Angstroms.

7. A method as in claim 6 wherein said gate layer is formed to a thickness of approximately 1,000 Angstroms.

8. A method as in claim 1 wherein said protective structure includes a layer of silicon nitride which is formed so that it overlies said gate layer and a silicon dioxide layer which is formed so that overlies said silicon nitride layer.

9. A method as in claim 8 wherein said silicon nitride layer has a thickness of approximately 1,000 Angstroms and said silicon dioxide layer has a thickness of approximately 1,000 Angstroms.

10. A method as in claim 1 wherein said protective structure includes a layer of polycrystalline silicon which is formed so that it overlies said gate oxide layer and a layer of silicon dioxide which is formed so that it overlies said layer of polycrystalline silicon.

11. A method as in claim 10 wherein said layer of polycrystalline silicon has a thickness of approximately 6,000 Angstroms and wherein said silicon dioxide layer has a thickness of approximately 3,000 Angstroms.

12. A method as in claim 1 wherein said first impurities are diffused through said opening in a dry atmosphere to minimize the growth of silicon dioxide during the diffusion.

13. A method as in claim 12 wherein said diffusion of said second impurity is carried out in a wet oxygen atmosphere to cause the formation of a thick layer of silicon dioxide.

14. A method as in claim 1 together with the step of depositing a layer of phosphorous-doped glass on the body and wherein said gate, source and drain contact metallization extends through the glass.

15. A method as in claim 1 wherein once said gate layer has been formed, it remains in place and is never removed.

16. A method as in claim 1 wherein said protective structure on said gate layer includes a layer of material different from the material of the gate layer and having etching properties different from that of the gate layer to permit formation of the channel in the desired location and with a controlled doping profile.

17. In a method for forming an MOS structure providing a semiconductor body of silicon having an impurity of one conductivity type and having a generally planar surface, forming a gate layer of silicon dioxide of relatively precise thickness on said surface, providing a protective structure on said gate layer, forming an opening in said protective structure adjacent said gate layer and exposing said surface, causing a first impurity to pass through said opening utilizing an edge of said protective structure as a mask to provide a first region in said semiconductor body, forming an additional opening in said protective structure adjacent said gate layer and exposing said surface, causing a second impurity to pass through said first and second openings in said protective structure to cause the formation of second regions in said body with the second region in said first named opening being disposed in said first region to provide a channel of precise length underlying the gate layer and forming gate, source and drain contact metallization.

* * * * *

UNITED STATES PATENT OFFICE
CERTIFICATE OF CORRECTION

PATENT NO. : 3,909,320

DATED : September 30, 1975

INVENTOR(S) : Thomas P. Gauge et al

It is certified that error appears in the above-identified patent and that said Letters Patent are hereby corrected as shown below:

IN THE INVENTORS' NAMES:

Delete "Gauge" and substitute therefor --Cauge--

Signed and Sealed this

*twenty-third* Day of *December 1975*

[SEAL]

*Attest:*

RUTH C. MASON
*Attesting Officer*

C. MARSHALL DANN
*Commissioner of Patents and Trademarks*